United States Patent [19]

Tatsuki

[11] Patent Number: 4,935,902
[45] Date of Patent: Jun. 19, 1990

[54] SEQUENTIAL ACCESS MEMORY

[75] Inventor: Koichi Tatsuki, Matsudo, Japan

[73] Assignee: Sharp Kabushiki Kaisha, Osaka, Japan

[21] Appl. No.: 238,241

[22] Filed: Aug. 30, 1988

[30] Foreign Application Priority Data

Aug. 31, 1987 [JP] Japan .................................. 62-218972

[51] Int. Cl.$^5$ .............................................. G11C 8/00
[52] U.S. Cl. ..................................... 365/239; 365/221; 365/230.09
[58] Field of Search .................. 365/194, 230.09, 233, 365/230.01, 239, 240, 221

[56] References Cited

U.S. PATENT DOCUMENTS 4,153,951 5/1979 Slenkovich ......................... 365/239

FOREIGN PATENT DOCUMENTS 55-38603 3/1980 Japan ................................... 365/194

*Primary Examiner*—Joseph A. Popek

[57] ABSTRACT

A sequential access memory to be used as a data delaying device in a digital circuit. The sequential access memory is provided with a storage portion which is capable of storing the data of the $(m \times 2 + l)$ words, and a counter which has an $(m \times 2 + l \times 2)$ base returns to the $(m+1)$ address after having accessed the addresses to the $(m \times 2 + l)$ address sequentially from the No. 1 of the storage portion, and accesses the address of No. 1 again after having accessed the addresses to the $(m+l)$ address sequentially from the $(m+l)$ address so as to repeat the similar counting operation. Therefore, the data of the two systems having a portion composed of the m words and the b portion composed of the l words may be outputted at a predetermined timing by a simplified, inexpensive circuit, which requires no output switching device.

4 Claims, 4 Drawing Sheets

SEQUENTIAL ACCESS MEMORY

BACKGROUND OF THE INVENTION

The present invention generally relates to a sequential access memory for use as a data delaying device in a digital circuit.

Generally, an arrangement as referred to in FIG. 5 is provided as a sequential access memory. The sequential access memory is adapted for inputting an input signal string composed of an a portion having m words of data and a b portion having l words of data as shown in FIG. 4(1), and for outputting an output signal string delayed from the input signal string by two units in the a portion and one unit in the b portion as shown in FIG. 4(2).

In FIG. 5, the a-portion two-unit delaying device 51 is composed of an m×2-words memory 52 having a memory capacity of m×2-words and a modulo m×2 counter 53 for effecting the modulo m×2 counting. A b-portion one-unit delaying device 55 is composed of an l-word memory 56 having a memory capacity of l words and an modulo l counter 57 for effecting the modulo l counting.

The modulo m×2 counter 53 and the modulo l counter 57 respectively have a clock input 53a and a clock input 57a, a count enable termlinal 53b and a count enable terminal 57b. The a/b switching input is connected to the count enable terminals 53b and 57b. When the a/b switch input is at the a portion, the clock is input into the clock input 53a. The modulo m×2 counter 53 counts up by the input of the clock to output the address into the m×2-words memory 52. When the a/b switch input is at the b portion, the clock is input into the clock input 57a. The modulo l counter 57 counts up by the input of the clock to output the address into the l-word memory 56.

The m×2-words memory 52 and the l-word memory 56 respectively receive the addresses from the modulo m×2 counter 53 and the modulo l counter 57 for reading and storing the data in the address. Namely, the modulo m×2 counter 53 and the modulo l counter 57 are commonly used for reading and storing, and the reading and storing are effected at the same time. But data that is one time old are read, instead of the data to be stored at that time. Accordingly, the data stored in a certain address of the memory 52 is read from the a portion when the modulo m×2 counter 53 comes back to the same address again, which requires the m×2 clocks. The l number of clocks are required by the b portion. The data read from the m×2-words memory 52 and the l-word memory 56 are to be outputted through an output switching device 58. The a/b switching input is connected to the output switching device 58. When the a/b switching input is at the a portion, the data from the m×2-words memory 52 are outputted through the output switching device 58. When the a/b switching input is at the b portion, the data of the l-word memory 56 is outputted through the output switching device 58.

The data stored in a certain address of the m×2-words memory 52 are read when the modulo m×2 counter 53 has accessed the address of the address again, but the m×2 clocks are required for the storing of the data to the reading thereof. As the counter 53 for accessing the address of the memory 52 is 2×m-base when the a portion has the m words, the modulo m×2 counter 53 is not operated while the a/b switching input is at the b portion, so that the data of the a portion are delayed by two units before being outputted. The l-number of clocks are required, in a certain address of the l-word memory 56, from the loading of the data to the reading of the data. When the b portion is the l-word, the counter 57 for accessing the address of the memory 56 is l-base. While the a/b switch input is at the a portion, the modulo l counter 57 is not operated, so that the data of the b portion are delayed by one unit before being outputted.

In the manner described aboved the input signal string shown in FIG. 4(1) is delayed, and may be outputted as the output signal string shown in FIG. 4(2).

However, the conventional sequential access memory respectively requires a separate memory and a separate counter for the data of the a portion and the data of the b portion. Also, an output switching device for switching the output of the two memories is required, which cause the circuit be become complicated and expensive.

SUMMARY OF THE INVENTION

Accordingly, an object of the present invention is to provide a sequential access memory, which does not require an output switching device; Thereby the number of elements and wiring are simplified.

Another important object of the present invention is to provide a sequential access memory, which is capable of delaying an input signal string as shown in FIG. 4(1) and outputting the signal as an output signal string shown in FIG. 4(2).

In accomplishing these and other objects, as shown in FIGS. 1, 2 and 4, in a sequential access memory, a storage portion and a counter are provided for accessing the address of the storage portion thereby, the two-system data inputs the a portion composed of m words and the b portion composed of l words under the control of the counter for outputting them at a predetermined delay timing. The present invention includes a storage portion that is adapted to store the data of the (m×2+l), words, and a counter which is a (m×2'+l×2) base for returning to the (m+1) address after having accessed the addresses to the (m×2+l) address sequentially from the No. 1 position of the storage portion, and again accesses the address of No. 1 position after having accessed the addresses to the (m+l) address sequentially from the (m+1) address for repeating a similar counting operation.

When the counter accesses the addresses to the (m×2+l) address sequentially from the No. 1 position of the storage portion with the data not being stored in the storage portion, the data a1 of the first a portion composed of the m words, the data b1 of the first b portion composed of the l words, and the data a2 of the second a portion are sequentially stored in the storage portion. Then, the counter returns to the (m+1) address for accessing the addresses to the (m+l) address sequentially from the (m+1) address, and the data b1 stored from the (m+1) address to the (m+l) address are read for storing the second data b2 of the b portion on the same address. Thereafter, the counter returns to the No. 1 position for accessing the addresses to the (m×2+l) address sequentially from the No. 1 address again, and the data a1, b2 and a2 previously stored are read and the next data a3, b3 and a4 are read. In the same manner, by the repetition of the data input and output, the input signal string of the two-system having the a portion composed of the m words and the b portion composed of the l words as shown in FIG. 4(1) is provided as the output signal string. The input signal string is delayed by two units in the a portion, and by the one unit in the b portion as shown in FIG. 4(2).

BRIEF DESCRIPTION OF THE DRAWINGS

These and other objects and features of the present invention will become clear from the following description taken in conjunction with the preferred embodiments thereof with reference of the accompanying drawings, in which.

DETAILED DESCRIPTION OF THE INVENTION

Figure 1:
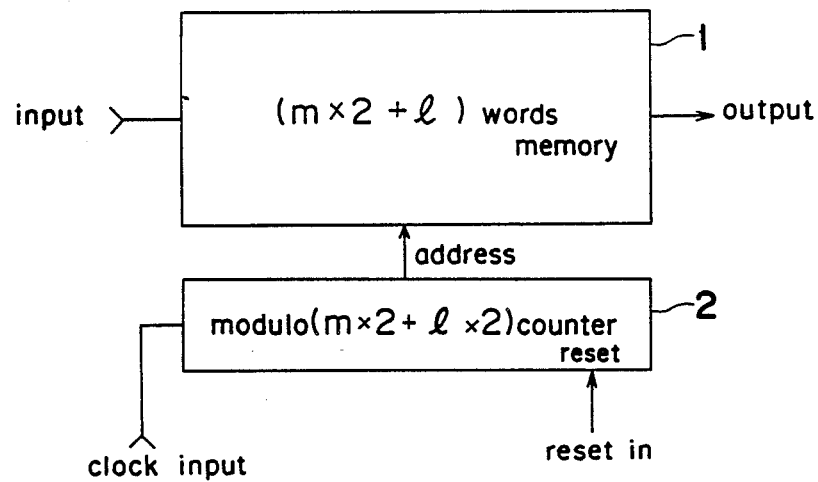
FIG. 1 is a block diagram showing a circuit construction in one embodiment of a sequential accesss memory of the present invention.

Before the description of the present invention proceeds, it is to be noted that parts are designated by like reference numerals throughtout the accompanying drawings.

Figure 2:
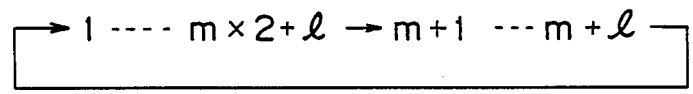
FIG. 2 is a view showing the counting method of the modulo $(m \times 2+l \times 2)$ counter in the embodiment.
Figure 3:
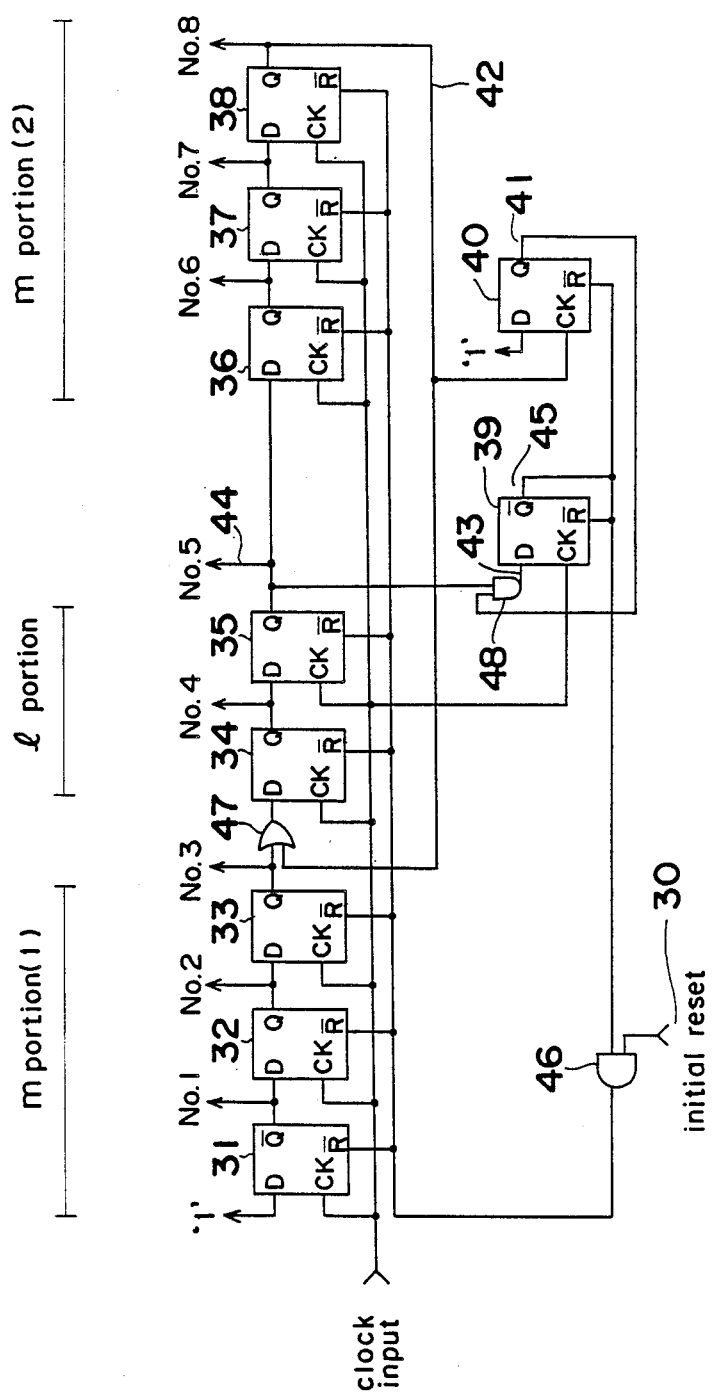
FIG. 3 is a diagram showing a concrete circuit of a counter in a case of $m=3$, $l=2$ in the embodiment.

Referring now to the drawings, there is shown in FIG. 1 a circuit construction in one embodiment of the present invention, wherein reference numeral 1 is a memory of the $(m \times 2+l)$ words for storing the data of the $(m \times 2+l)$ words, and reference numeral 2 is a modulo $(m \times 2l \times 2)$ counter. FIG. 2 is a view showing the counting method of the modulo $(m \times 2+l \times 2)$ counter 2. FIG. 3 is a view showing a concrete circuit example in the case of $m=3$ and $l=2$ of the modulo $(m \times 2+l \times 2)$ counter 2.

In FIG. 3, when an initial reset input 30 is "L", the output of the AND gate 46 is "L". The $\overline{R}$ input of the flip-flops 31 through 40 are "L" so that they are reset, and the Q output is "L" and the $\overline{Q}$ output is "H". At this time, the $\overline{Q}$ output of the flip-flop 31 of the No. 1 becomes "H" in level to show the No. 1 by the counter. All the other addresses are "L" in level. The "H" level is shifted to No. 2 through No. 8 sequentially from No. 1, each time clock inputs increment by one, to sequentially change the address. When the "H" level has been shifted to No. 8, the clocks are outputted from the Q output of the flip-flop 38 and inputted to the CK input of the flip-flop 40, so that the Q output thereof becomes "H". The Q output of the flip-flop 38, which is "H" is shifted to No. 4 through the OR gate 47 by the next clock so as to show No. 4. Then, it is shifted to No. 5, so that No. 5 output 44 becomes "H". As the Q output 41 of the flip-flop 40 is already "H", the D input 43 of the flip-flop 39, which is the output of the AND gate 48 to be inputted from the outputs 41 and 44, becomes "H", and the $\overline{Q}$ output 45 becomes "L" by the next clock input so as to effectively make the flip-flop 39 reset, and the condition returns to the first condition. As described hereinabove, the counter returns to 1 after it has counted 1, 2, 3, ... 7, 8→4→5 so as to repeat the same counting. Since $m=3$, $l=2$, $m \times 2+l=8$, $m+1=4$, and $m+l=5$ are established, the counting method of FIG. 2 is satisfied.

Figure 4:
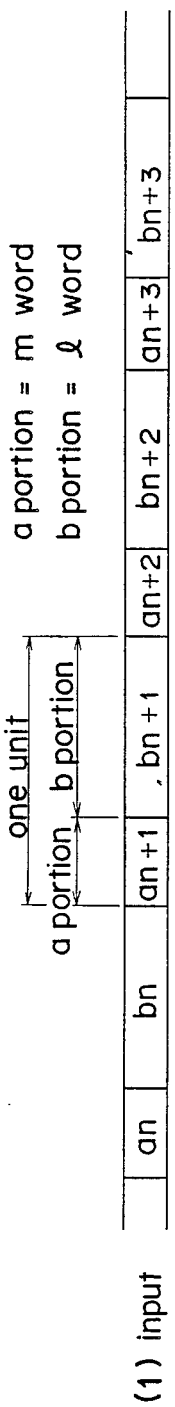
FIG. 4 contains views, each showing an input signal string of two systems for the a portion composed of the m words and the b portion of the l words, and an output signal string delay by two units in the a portion and by one unit in the b portion in the input signal string so as to be outputted.
Figure 5:
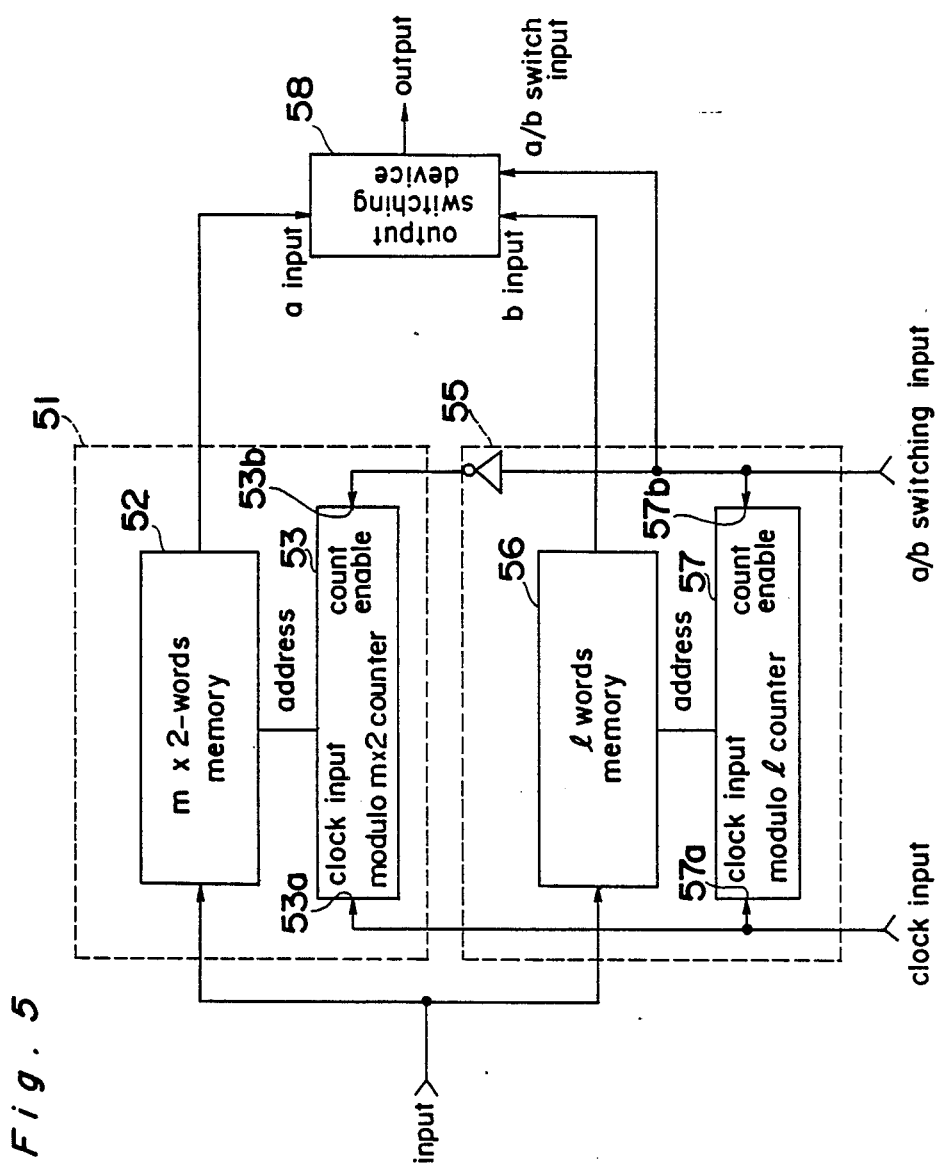
FIG. 5 is a block diagram showing the construction of the conventional sequential access memory.

The optional m and l may be realized by changes in the stage number of the m portion (1), l portion, m portion (2), and likewise. The modulo $(m \times 2+l \times 2)$ counter 2 shown in FIG. 1, constructed as described above, effects its initial resetting by the head portion of the initial data of the a portion in the input signal string of FIG. 4(1) so as to successively store the data in the $(m \times 2+l)$ word memory 1. As no data exist in the $(m \times 2+l)$ word memory 1, no data are outputted. Then, the counter 2 returns to the $(m+1)$ address by the $(m \times 2+l+l)$th clock. The b portion of one unit old is already stored from the $(m+1)$ address to the $(m+l)$ address. As the data are sequentially read, the data of the b portion are delayed by one unit and are outputted. Simultaneous with the reading of the data, the data are stored. When the counting is effected as far as $(m+l)$ by the clocks of the l number, the counter returns to No. 1. Although the data of the a portion has been stored at this No. 1, the $(m \times 2+l \times 2)$ number of clocks are required to return to the No. 1 again after going around the count from the No. 1. The clock is one for two units, with the data of 1 through m addresses being delayed by two units and being outputted. Also, the a-portion data of the $(m+l+1)$ through $(m+l+m)$ address are likewise delayed by two units. As the data of the $(m+1)$ through $(m+l)$ address are rewritten in the b portion at the time when the counter has returned from the $(m \times 2+l \times 2)$ address to the $(m+1)$ address with the former cycle, the data are delayed by one unit and are outputted. By the repetition of the similar operation hereinafter, the input signal string of FIG. 4(1) is delayed by two units in the a portion, and by one unit in the b portion, so that the output signal string of FIG. 4(2) may be provided.

In the embodiment, this counter is composed of flip-flops, but the counter may be alternatively composed of software operated by a microprocessor.

As is clear from the foregoing description, according to the arrangement of the present invention, the sequential access memory is provided with a storage portion which is capable of storing the data of the $(m \times 2+l)$ words, and a counter which is an $(m \times 2+l \times 2)$ base returns to the $(m+1)$ address after having accessed the addresses to the $(m \times 2 \times l)$ address sequentially from the No. 1 of the storage portion, and accesses the address of No. 1 again after having caused the addresses to the $(m+l)$ address sequentially from the $(m+1)$ address so as to repeat the similar counting operation. Therefore, the data of the two systems having the a portion composed of the m words and the b portion composed of the l words may be outputted at a predetermined delay timing by a simplified, inexpensive circuit, which requires no output switching device.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sequential access memory comprising:
   input means for receiving an input signal including a first portion having a first predetermined number of words and a second portion having a second predetermined number of words;

storage means having a capacity for sequentially storing an amount of data equalling two times said first predetermined number of words plus said second predetermined number of words; and counting means for sequentially accessing data from said storage means corresponding to a first position of said storage means to a position of said storage means equal to two times said first predetermined number of words plus said second predetermined number of words and sequentially accessing data corresponding to a position of said storage means equal to said first predetermined number of words plus one to a position of said storage means equal to said first predetermined number of words plus said second predetermined number of words, said counting means develops an output signal string which delays said first portion by two units of said first portion and delays said second portion by one unit of said second portion where each unit contains $(m+1)$ words where m is a positive integer.

2. A sequential access memory as claimed in claim 1, wherein said counting means comprises a plurality of flip-flop devices.

3. A sequential access memory as claimed in claim 1, wherein said counting means comprises a microprocessing device.

4. A sequential access memory as claimed in claim 1 wherein the number of first predetermined words is different than the number of second predetermined words.

* * * * *